US012777607B1

(12) United States Patent
Kelly et al.

(10) Patent No.: US 12,777,607 B1
(45) Date of Patent: Oct. 27, 2026

(54) RACK WALL FOR HOUSING BATTERY BACKUP UNITS

(71) Applicant: Amazon Technologies, Inc., Seattle, WA (US)

(72) Inventors: Noah Thomas Kelly, Cascade, CO (US); Darin Lee Frink, Lake Tapps, WA (US); William Mark Megarity, Bonney Lake, WA (US); Bradley David Urban, Bainbridge Island, WA (US); Zhihong Ye, Austin, TX (US)

(73) Assignee: Amazon Technologies, Inc., Seattle, WA (US)

( * ) Notice: Subject to any disclaimer, the term of this patent is extended or adjusted under 35 U.S.C. 154(b) by 75 days.

(21) Appl. No.: 18/755,265

(22) Filed: Jun. 26, 2024

(51) Int. Cl.
*H05K 7/14* (2006.01)
*H05K 7/18* (2006.01)

(52) U.S. Cl.
CPC ......... *H05K 7/1492* (2013.01); *H05K 7/1485* (2013.01); *H05K 7/1488* (2013.01); *H05K 7/18* (2013.01)

(58) Field of Classification Search
CPC .. H05K 7/1492; H05K 7/1488; H05K 7/1489; H05K 7/1487; H05K 7/1491; H05K 7/1457; H05K 7/183; H05K 7/20818; H05K 7/20709; H05K 7/18; H05K 7/20172; G06F 1/189; G06F 1/26; G06F 1/266; G06F 1/20; G06F 1/188; G06F 11/2015; H02J 9/061; H02J 2310/16; H02J 9/06; H02J 9/00; H02J 7/0068
See application file for complete search history.

(56) References Cited

U.S. PATENT DOCUMENTS

| | | | | |
|---|---|---|---|---|
| 6,421,243 | B1 * | 7/2002 | Ives | H05K 7/1459 439/155 |
| 6,498,716 | B1 * | 12/2002 | Salinas | G06F 1/189 439/341 |
| 6,833,995 | B1 * | 12/2004 | Hsue | H05K 7/1425 |
| 9,374,926 | B1 * | 6/2016 | Fontana | H05K 7/1492 |
| 9,392,720 | B1 * | 7/2016 | Kim | H05K 7/1492 |
| 10,905,025 | B1 * | 1/2021 | Thomas | H05K 7/1487 |
| 10,932,388 | B1 * | 2/2021 | Davis | G06F 1/188 |
| 12,108,559 | B2 * | 10/2024 | Rearick | H05K 7/1492 |
| 12,443,251 | B2 * | 10/2025 | Jones | H02B 1/20 |
| 2004/0190241 | A1 * | 9/2004 | Cyphers | H05K 7/1457 361/829 |
| 2007/0047100 | A1 * | 3/2007 | Takahashi | H02J 9/061 359/689 |
| 2012/0069514 | A1 * | 3/2012 | Ross | H05K 7/20718 361/679.33 |
| 2012/0194350 | A1 * | 8/2012 | Crisp | G06F 1/26 340/815.42 |

(Continued)

*Primary Examiner* — Gage Crum

(74) *Attorney, Agent, or Firm* — Kilpatrick Townsend & Stockton LLP

(57) ABSTRACT

A system can include a rack that may include a frame arranged to form boundaries of an internal volume sized for receipt of a server, power shelf, and/or other sliding chassis into the rack. At least one sidewall may be incorporated into the frame along a lateral side and include compartments. The set of compartments can be sized for receiving battery cartridges, e.g., which may be included to supply backup power to one or more components in the rack.

17 Claims, 5 Drawing Sheets

(56) References Cited

U.S. PATENT DOCUMENTS

| | | | | |
|---|---|---|---|---|
| 2012/0201002 | A1* | 8/2012 | Schmitt | H05K 7/1492 361/730 |
| 2012/0327591 | A1* | 12/2012 | Jau | H05K 7/1492 361/679.48 |
| 2014/0049907 | A1* | 2/2014 | Wei | G06F 1/188 361/679.51 |
| 2015/0295389 | A1* | 10/2015 | Steeves | H05K 7/14 361/624 |
| 2016/0135323 | A1* | 5/2016 | Haroun | H05K 7/1488 361/679.53 |
| 2017/0201076 | A1* | 7/2017 | Chen | H05K 7/1492 |
| 2018/0027700 | A1* | 1/2018 | Adiletta | H04Q 11/0003 |
| 2018/0302477 | A1* | 10/2018 | Thul | H04L 41/28 |
| 2019/0327851 | A1* | 10/2019 | Schmidt | H05K 7/18 |
| 2020/0205309 | A1* | 6/2020 | Rearick | G06F 1/266 |
| 2020/0214153 | A1* | 7/2020 | Holahan | H05K 7/20318 |
| 2022/0344967 | A1* | 10/2022 | Nordin | G06F 1/189 |
| 2024/0222712 | A1* | 7/2024 | Davis | H01M 10/425 |
| 2024/0224458 | A1* | 7/2024 | Norton | H05K 7/186 |

* cited by examiner

RACK WALL FOR HOUSING BATTERY BACKUP UNITS

BACKGROUND

Many critical electrically powered computing systems include one or more battery backup units that provide backup power to the system in the event of a loss of utility power. Battery backup units, however, may occupy a substantial amount of space and lead to a tradeoff between utilizing space for battery backup units and using space for computing equipment to be served by the battery backup units.

BRIEF DESCRIPTION OF THE DRAWINGS

Various embodiments in accordance with the present disclosure will be described with reference to the drawings, in which.

DETAILED DESCRIPTION

Embodiments herein may be directed to structures that may house battery backup units for electronic components. In various examples, battery backup units may be received in walls of a rack that may be utilized for holding appliances, such as computer servers, networking hardware components, and/or other computing devices that may be used in computer networks for datacenters or other environments. The structures may include suitable components in the frame of the rack so that battery cartridges can be inserted into space formed in or along the wall of the rack, e.g., without substantially consuming space within a main volume defined between the rack walls and used for other components such as a server chassis or a power shelf to provide power to the chassis. Providing the battery units within and/or along the walls of the rack may allow the racks to be provided without consuming space that may be at a premium for containing other computing equipment.

The rack may include one or more suitable busbars, such as positioned along a rear of the rack, positioned recessed into a sidewall, and/or positioned inwardly from a rear of the rack. Each busbar may provide connection among the batteries and the power shelf, e.g., so that the batteries can be used for supplying power to the power shelf in the event of an outage event. The batteries can be pre-installed to permit the rack to be installed as a fully pre-assembled unit, or the rack may be transported to an installation location with the batteries separate from the rack (e.g., which may facilitate ease of installation based on ease of overall handling with a smaller amount of weight than if all of the batteries were installed prior to shipping or transport).

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Figure 1:
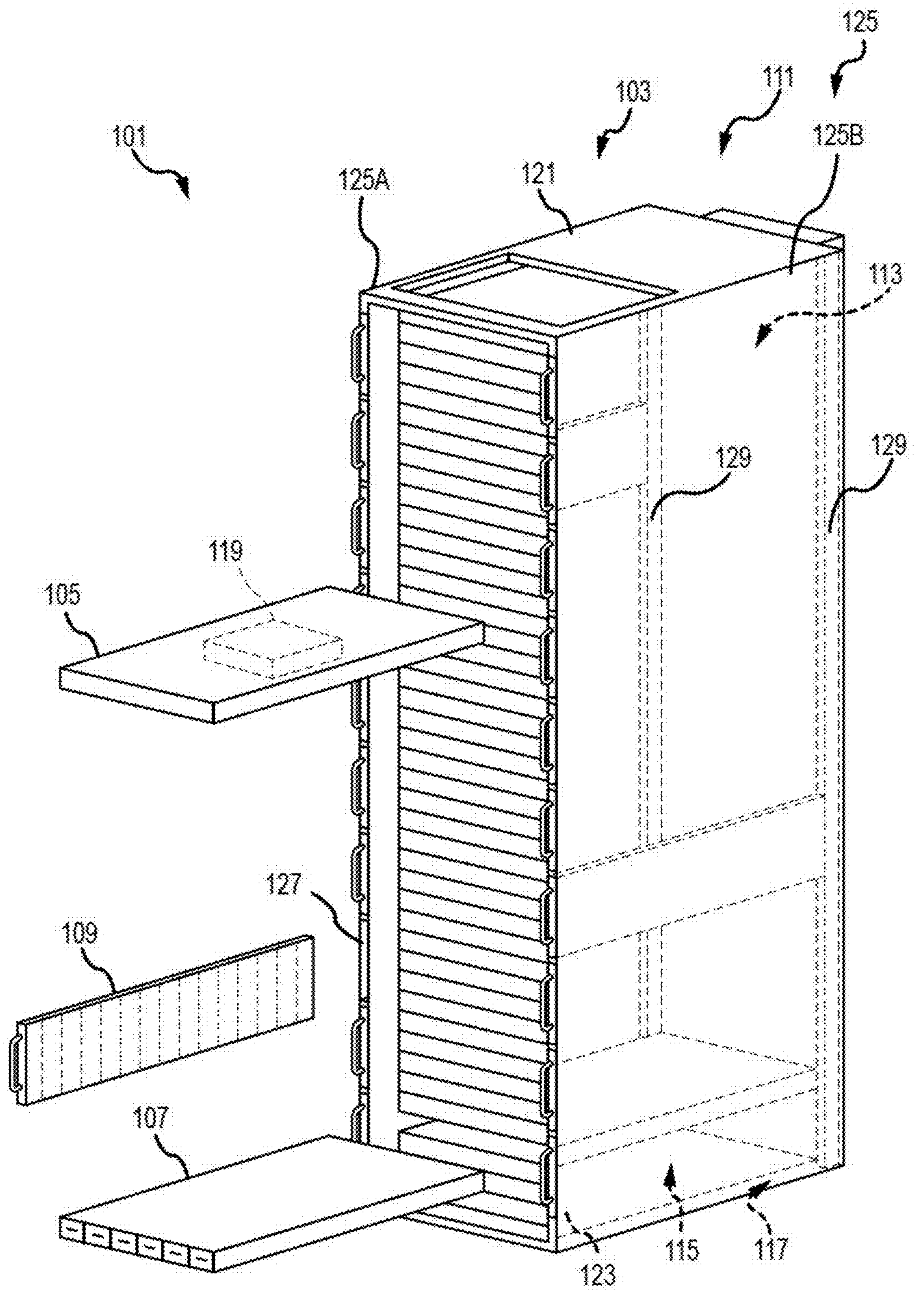
FIG. 1 illustrates a perspective view of an example of a system having a rack with sidewall compartments for battery units in accordance with various embodiments.

FIG. 1 illustrates a perspective view of an example of a system 101 in accordance with various examples. The system 101 may correspond to a computing system assembly for example. The system 101 is shown with a rack 103, a chassis 105, a power shelf 107, and a set of power units 109, although more, fewer, and/or other components may be utilized. Any power unit 109 may include a battery unit, a power supply, a capacitor (e.g., a super capacitor), and/or other structure capable of storing and/or supplying electrical power, although for simplicity herein the power unit 109 in the description hereinafter will be referred to as a battery unit 109, with it being understood that other described structures may be included additionally or alternatively.

The rack 103 can include a frame 111 that may include suitable structural components. The frame 111 may be arranged to form boundaries of an internal volume 113 of the rack 103. The internal volume 113 can be sized to receive—or sized for receipt of—other components of the system 101. For example, the internal volume 113 is shown with various instances of the power shelf 107, the chassis 105, and the battery units 109 received, while one instance of each of these components is shown exploded from the rack 103 and outside of the internal volume 113 for ease of viewing. In various examples, the internal volume 113 may be sized to accommodate instances of the chassis 105 and/or the power shelf 107 that may be sized as 1 U in height, 2 U in height, or any other partial or full increment of rack units U. In an illustrative example, the internal volume 113 may correspond to a front opening having a width of 21 inches, a depth of approximately 42 inches, and a height of 48.5 U while an overall width of the frame 111 may be approximately 24 inches, although any other combination of dimensions may be utilized, such as to accommodate 21-inch servers, 19-inch servers, or other standardized or predetermined sizes of components.

The internal volume 113 may be divided into suitable sub-portions or sub-volumes. The internal volume 113 may include a main volume 115, which may be suitable for receiving the sliding components such as the chassis 105 and the power shelf 107. The main volume 115 may correspond to a width of a main opening of the rack, such as may be defined between outer lateral walls in use. The internal volume 113 can also include a periphery volume 117. The main volume 115 may be accompanied at lateral sides by one or more portions of the periphery volume 117, for example. The periphery volume 117 may be suitably sized for battery units 109 and/or may correspond to space that is not conflicting with introduction of the chassis 105 and/or the power shelf 107. For example, the periphery volume 117 may be positioned laterally from the main volume 115 in use. The periphery volume 117 may correspond to a volume not typically utilized or that may be underutilized for other parts in comparison to other racks, datacenters, workspaces, and/or environments.

The chassis 105 and/or the power shelf 107 can be configured for sliding into the rack 103. Suitable rails and/or other interfaces can be utilized to facilitate sliding, latching, and/or mounting into the rack 103 (e.g., in the main volume 115). The chassis 105 may be slidingly received in the internal volume 113 of the rack 103 in use. The chassis 105 may include an appliance 119.

The appliance 119 may correspond to a server component that is borne by the chassis 105. Additionally or alternatively, the appliance 119 can correspond to any other form of computing equipment component. Examples may include heat-generating or other components that may be borne by the chassis 105. The heat-generating components may correspond to integrated circuits (including chips), or other heat-generating components. Non-limiting examples include a processor, an input/output (I/O) chip, a baseboard management controller, a chip, a card (e.g., which may include a printed circuit board various that bears other components), a voltage regulator, a hot swap control, an inductor, a resistor, or a capacitor). Other non-limiting examples may include a Field Programmable Gate Array (FPGA), a Complex Programmable Logic Device (CPLD), and a System-on-a-Chip (SoC). Each heat-generating component may include one or more subcomponents that generate heat to be carried away or otherwise addressed by a suitable cooling system, e.g., which may include structure arranged to provide airflow and/or coolant flow over, by, and/or past the appliance 119 (such as by supplying coolant through cooling plates, heat exchangers, or other suitable structure for absorbing and/or carrying away heat from such heat-generating components).

The power shelf 107 can also be suitably sized and formed to be received in the internal volume 113 of the rack 103. The power shelf 107 may be suitably connected with the server component or other appliance 119 in the chassis 105 in use to supply power to the appliance 119. For example, suitable wiring harnesses or other structures may be utilized to connect the power shelf 107 with the chassis 105 and/or the appliance 119 in use.

The power shelf 107 may include suitable components for the provision of power to the appliance 119. The power shelf 107 can include suitable power-related components, such as an inverter, an adapter, and/or a converter and/or may perform functions such as inverting between alternating current and direct current, stepping voltage up or down, or otherwise transforming power from a given input state to a suitable output state for interoperability with other components, such as the appliance 119. As a non-limiting example, the power shelf 107 may include inverters that may receive alternating current from a utility line and convert to direct current to supply the appliance 119. The power shelf 107 additionally or alternatively may include components that may be suitable to provide energy to the battery units 109, such as to recharge battery units 109 after use.

The frame 111 can include suitable walls and/or other structure to support other components of the system 101 in use. Elements of the frame 111 can be formed of sheet metal and/or any other suitable structural material that may be suitable for load bearing and/or that may exhibit suitable formability to generate or be formed into structures described herein.

The frame 111 may include a top 121. The top 121 may define an upper boundary of the main volume 115, for example. The top 121 is shown as a panel having a cut-out to provide access through the upper margin of the rack 103, although the top 121 can include any combination of continuous or discontinuous surfaces in use.

The frame can further include a bottom 123. The bottom 123 can define a lower boundary of the main volume 115. The bottom 123 is shown as having a continuous panel construction, although the bottom 123 (e.g., similar to the top 121) may include any suitable combination of continuous or discontinuous structure. In some examples, the bottom 123 may be coupled with suitable casters, rollers, or other structure to facilitate movement of the rack 103 (and brakes or other components may be included to disable rollers and secure the rack 103 in a position in use).

The frame 111 is further shown with a pair of opposing sidewalls 125. For example, the rack 103 is shown with a left sidewall 125A and a right sidewall 125B. The sidewalls 125 are each shown arranged or incorporated into the frame 111 along a lateral side (e.g., along a right side and a left side of the frame 111). Accordingly, the right sidewall 125B and the left sidewall 125A may each correspond to and/or may each alternatively be referred to as a lateral sidewall 125.

The lateral sidewall 125 can be coupled with the top 121 and the bottom 123. For example, the top 121 and the bottom 123 along with the right sidewall 125B and the left sidewall 125A may form the frame and provide a rectangular structure in which other components of the system may be supplied or supported. Each sidewall 125 may define a lateral boundary of the main volume 115.

At least one of the sidewalls 125 can include compartments 127. The compartments may extend into the frame 111 and may be suitably sized for receiving battery units 109 in use. For example, in use, the battery units 109 may be installed into the compartments 127 and may be connected in that position with a suitable busbar 129, which may provide connection to the power shelf 107 in use, for example. The busbar 129 may be positioned near a rear of the rack 103, such as in the internal volume 113, in the main volume 115, and/or in the periphery volume 117. The system 101 may be equipped with one busbar 129 along the left side of the rack 103 and another busbar 129 along the right side of the rack 103, e.g., which may provide connection between battery units 109 in each of the lateral walls 125 relative to the power shelf 107. The busbar 129 may correspond to a member formed of copper or other electrically conductive material that may be suitable for providing electrical current, such as for power provision and/or transmission in use.

The battery units 109 may correspond to a set of battery cartridges that are sized to be received within the compartments 127 in the lateral sidewall 125. The battery units 109 may be received within the compartments 127 and may be connected with the power shelf 107 to supply backup power to the power shelf 107 in the event of a loss of power event, for example. In various embodiments, the compartments 127 and/or the battery units 109 may be arranged laterally from the main volume 115. For example, this may correspond to being positioned laterally from the chassis 105 and/or the power shelf 107 in use.

The busbar 129 may be engageable from the compartments 127. The busbar 129 may be suitably arranged to provide interconnection among components and/or avoid interfering with installation or movement of other components that may be installed relative to the rack 103. In various embodiments, the busbar 129 may be positioned within or along lateral sidewall 125. The busbar 129 may be positioned laterally from the main volume 115. Additionally or alternatively, the busbar 129 may be positioned forward of the rear of the internal volume 113. In some embodiments, the busbar 129 may be engaged along a front side by a battery unit 109 and may be engaged along a lateral side by a power shelf 107 and/or a chassis 105.

Figure 2:
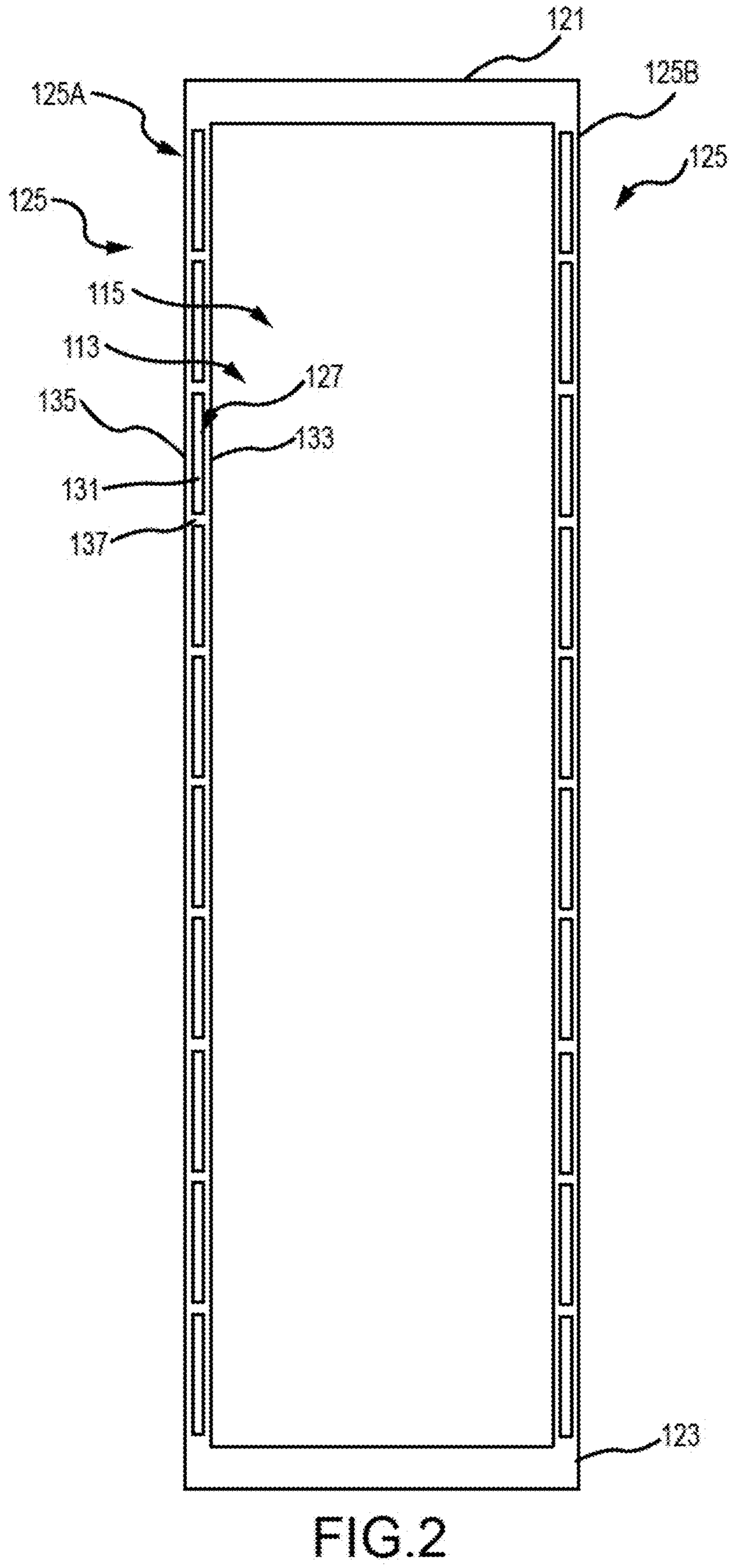
FIG. 2 illustrates a front view of an example of a rack that may be used in the system of FIG. 1 in accordance with various embodiments.

FIG. 2 illustrates a front view of an example of the rack 103 in isolation from other components of the system 101. The rack 103 may be formed with a suitable construction to form the compartments 127 in at least one lateral sidewall 125, such as in either or both of the left sidewall 125A or the right sidewall 125B. The compartments 127 may be formed as continuous openings 131 extending continuously rearwardly through the lateral sidewall 125. For example, the compartment 127 may extend into the page in the view in FIG. 2. Each opening 131 in FIG. 2 is shown visible along a front or forming an entrance into a compartment 127 from a front of the lateral sidewall 125.

The sidewall 125 may include an interior panel 133 (e.g., a lateral interior panel). The interior panel 133 may define a lateral boundary of the main volume 115 of the internal volume 113. The lateral wall 125 may further include an exterior panel 135 (e.g., a lateral exterior panel). The exterior panel 135 may be spaced outwardly from the interior panel 133. The exterior panel 135 may define an exterior boundary of the rack 103, for example. A set of crossbars 137 may extend inwardly from the exterior panel 135. The interior panel 133 and the exterior panel 135 can be joined by the set of crossbars 137, for example. The crossbars 137 may span between the interior panel 133 and the exterior panel 135. The crossbars 137 may be vertically spaced from one another. The structure of the lateral sidewall 125 may define the set of compartments 127 in use to be suitably sized for receiving the battery units 109, for example. The compartments 127 may be bounded on opposite lateral sides by the interior panel 133 and the exterior panel 135 and/or may bounded on opposite vertical sides by the crossbars 137.

The interior panel 133, the exterior panel 135, and the crossbars 137 may be integrally formed in some examples, such as by extruding the lateral sidewall 125 as a single monolithic structure. In some embodiments, the lateral walls 125, the top 121, the bottom 123 may be integrally formed. Additionally or alternatively, structures of the frame 111 of the rack 103 may be suitably coupled by welding, chemical bonding, mechanical fasteners, or other fastening techniques.

Figure 3:
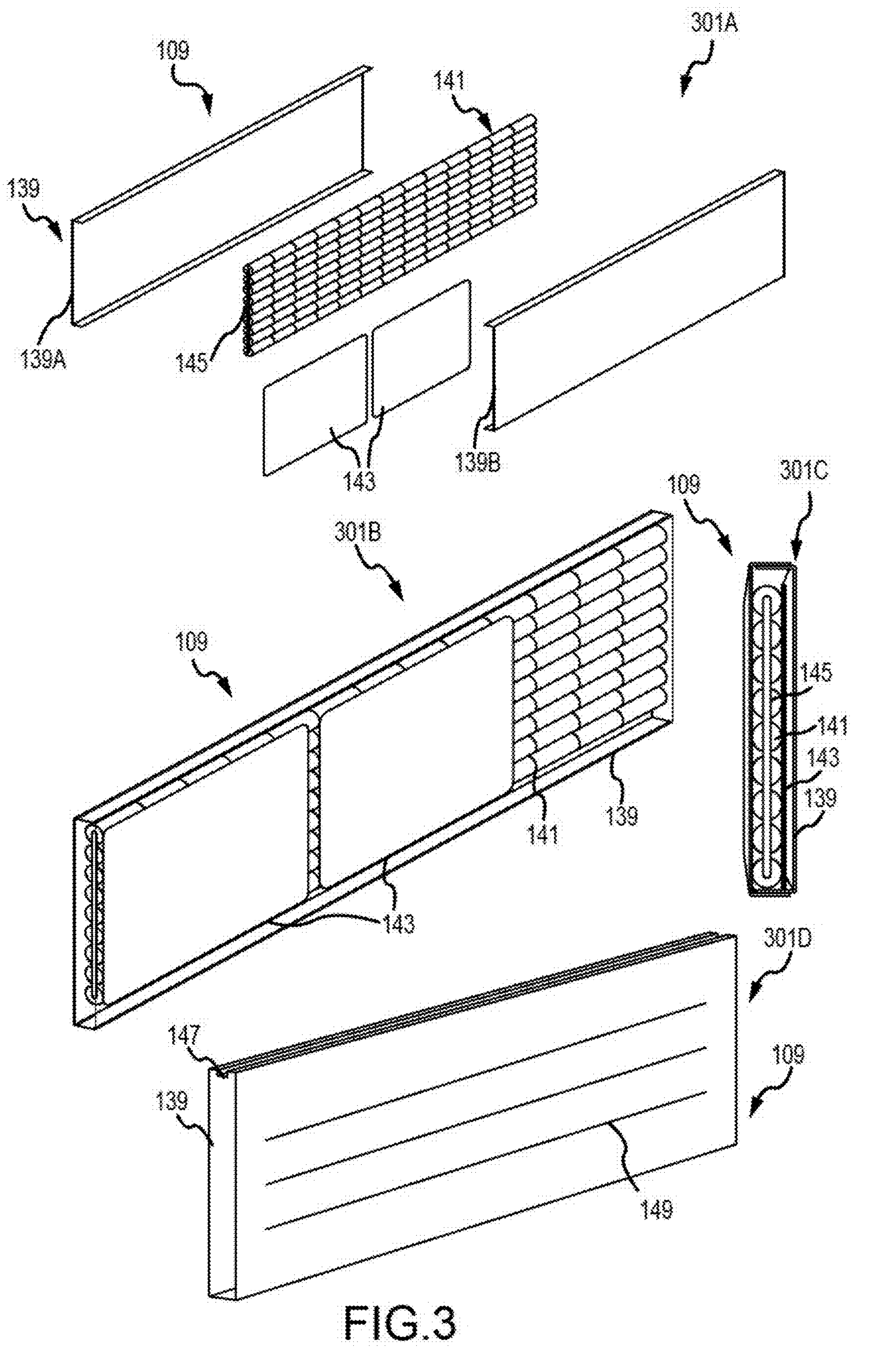
FIG. 3 illustrates various examples of features that may be included in a battery unit that may be used in the system of FIG. 1 in accordance with various embodiments.

FIG. 3 illustrates various views of a battery unit 109 and depicts various examples of features that may be included in the battery unit 109. For example, the battery unit 109 is shown in an exploded view 301A, a partially assembled view 301B, an end view 301C, and a perspective view 301D.

As may be best seen in the exploded view 301A, the battery unit 109 may include a shell 139, a plurality of battery cells 141, an electronics card 143, and connector 145. The shell 139 may be formed of bent sheet metal, extruded metal, plastic, and/or other suitable load bearing material. In some embodiments, the shell 139 may be formed of material with suitable thickness, strength, rigidity, and/or other characteristic to provide structural support for the rack 103. For example, the shell 139 may be formed so that when the shell 139 is installed in the rack 103, the shell 139 may provide reinforcement or mitigate against lateral and/or vertical deflection of other elements of the rack 103. The shell 139 may be capable of connecting one or more locations along the shell 139 to provide structural support to the rack 103, such as attaching by a latch at the front and/or by attaching by other latches or other anchoring fixtures at other locations along a length, height, and/or width of the shell 139. In some embodiments, the shell 139 may be formed of material with suitable thermal conductivity to dissipate heat from the battery cells 141 into the lateral wall 125 of the rack 103. The shell 139 is shown in the exploded view 301A as including two components that may snap together or otherwise couple together to form a suitable enclosure for the battery units 109. The battery units 109 may be formed as cartridges that may be suitably installed into the compartments 127 (e.g., FIG. 1 or 2) in use. The shell 139 is shown with the shell parts 139A and 139B that may correspond to clam shell components, for example. As may best be seen in the perspective view 301D, the shell 139 may be formed with a suitable keying feature 147 to facilitate alignment and/or securing of the battery unit 109 in use. Additionally or alternatively, (e.g., as may best be seen in the perspective view 301D) ribs or ridges or other surface features 149 or grooves may be included in the shell 139 and may provide rigidity or engagement guides for alignment in use. In some examples, the shell 139 may be extruded as a single contiguous component or otherwise suitably formed to be able to contain other components of the battery unit 109.

The battery cells 141 can correspond to lithium-ion battery cells or any other suitable battery technology. The battery cells 141 may be suitably arranged and connected to accomplish or achieve a target voltage and or amount of power to be available from the battery unit 109. Although the battery cells 141 are shown in an array of thirteen per row and nine per column, any suitable arrangement and/or number of battery cells 141 may be utilized. In various arrangements, the battery cells 141 may include a parallel-connected series of lines that each include multiple battery cells 141 connected in series. For example, in FIG. 3, each row may be connected in series and then each series-connected row may be connected in parallel to provide voltage and/or power target values for the battery unit 109 in use.

The connector 145 may connect subsets of the battery cells 141 with each other, may connect battery cells 141 with the electronics card 143, and/or may be suitably arranged to provide connection between components of the battery unit 109, the busbar 129, and/or other components of the system 101 in use. The connector 145 may correspond to any single structure or combination of multiple structures to accomplish one or more of such functions in use.

The electronics card 143 may be included in one or more parts and may be configured for at least one of controlling or monitoring operation of the battery cells 141. For example, the electronics card 143 in some arrangements may be suitably configured to monitor a health of the battery cells 141 to enable technicians to be able to replace battery cells 141 that may be faulty or in need of replacing or maintenance. Additionally or alternatively, the electronics card 143 may include suitable structure to allow the battery unit 109 to control when power is supplied from and/or to the battery unit 109, e.g., in response to a power outage event and/or to recharge batteries following a power outage event. The electronics card 143 may include one or more suitable controllers to perform associated functions, for example.

Functions of a suitable controller may be performed under the control of one or more computer systems configured with executable instructions and may be implemented as code (e.g., executable instructions, one or more computer programs, or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory. Non-limiting examples of the computer-readable storage medium may include a hard disk, random access memory, read only memory, etc.

Figure 4:
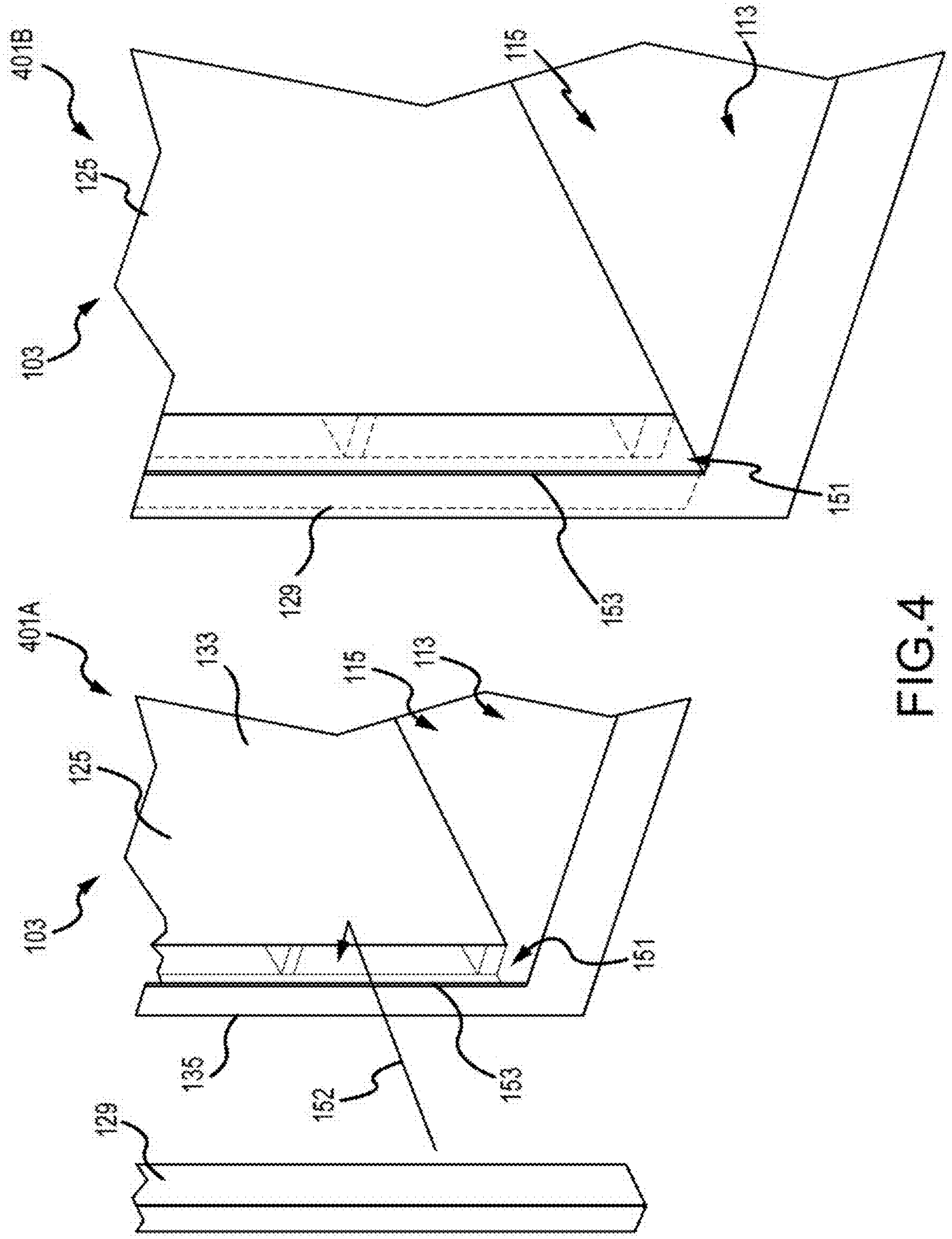
FIG. 4 illustrates a portion of a rack that may be utilized for receiving a busbar that may be used in the system of FIG. 1 in accordance with various embodiments.

FIG. 4 illustrates a first view 401A and a second view 401B of a portion of the rack 103 that may be suitable for receiving a busbar 129 in use. The rack 103 may include a recess 151, e.g., which may be included in the lateral sidewall 125, for example. In some examples, the interior panel 133 extends a shorter distance toward a rear of the rack than the exterior panel 135. This may define the recess 151.

As illustrated by arrow 152, the busbar 129 may be installed and/or received into the recess 151, e.g., by moving from a separated and/or ready-to-install position (such as depicted in the first view 401A in FIG. 4) and moving into an installed position (such as depicted in the second view 401B in FIG. 4). The busbar 129 may be received in a suitable position for establishing connection between the set of battery units 109 and the power shelf 107 for example. The recess 151 may be bounded on a rear side of the rack by a flange 153 in use. The recess 151 may be suitably sized so that the busbar 129 is received flush along the lateral wall 125 and not extending into the main volume 115 of the internal volume 113. For example, the internal volume 113 may include the recess 151 in a position outside of the main volume 115 and/or in the periphery volume 117 (FIG. 1). Although the busbar 129 is shown arranged with an outer surface flush with the interior panel 133 or other portion of the lateral wall 125, the busbar 129 may be recessed from the interior panel 133, stand proud of the interior panel 133, or may be otherwise positioned in a suitable position for establishing connection among parts.

Figure 5:
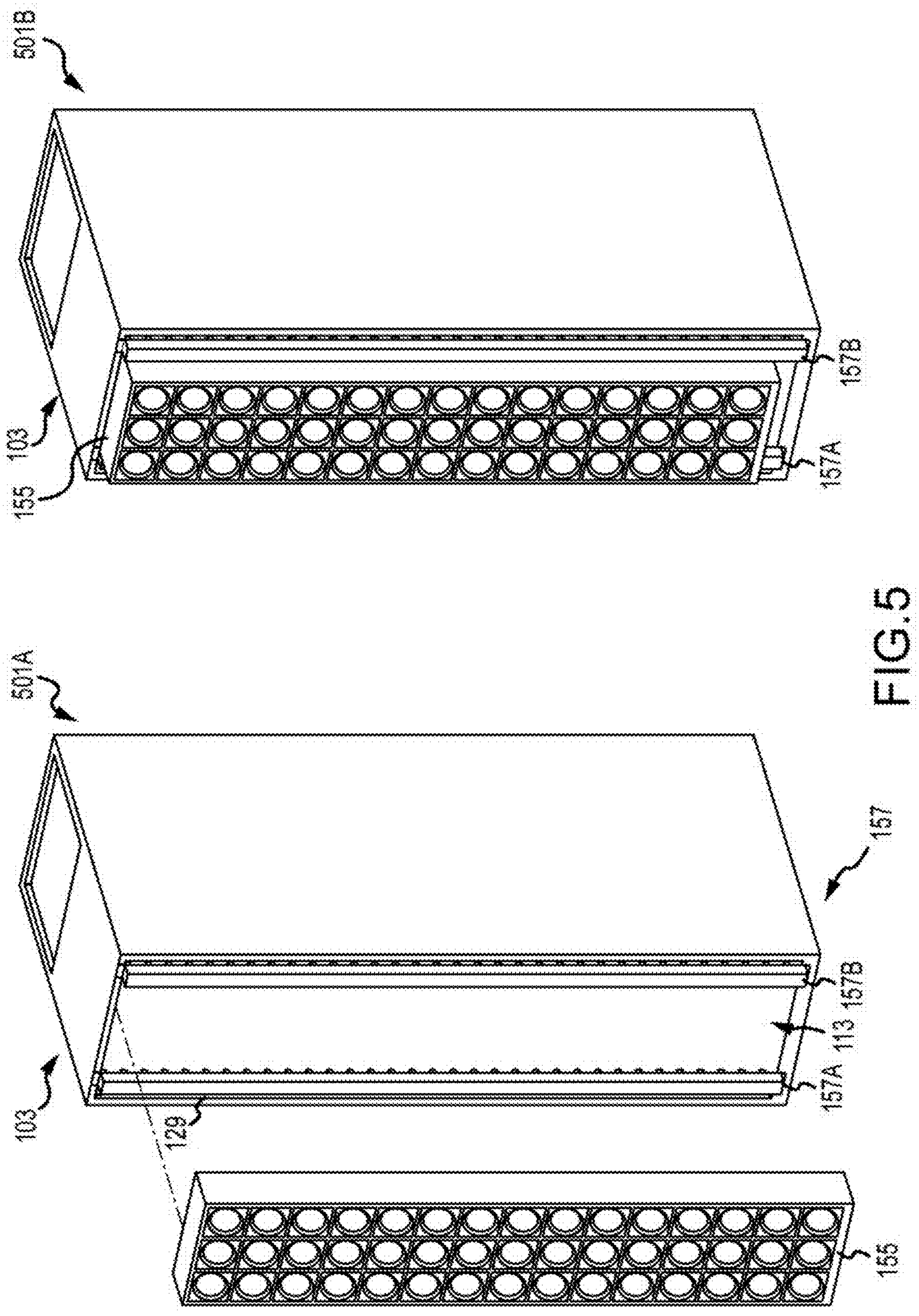
FIG. 5 illustrates examples of various components that may be included along a rear of a rack in the system of FIG. 1 in accordance with various embodiments.

FIG. 5 illustrates some examples of other components that may be included with the rack 103, such as along a rear of the rack 103 in use. The busbar 129 being included within the internal volume 113 may avoid occupying and/or obstructing a rear of the rack 103 with the busbar 129 and/or may provide sufficient available space to allow other structures to be received along the rear of the rack 103. For example, the rack 103 can be equipped with a fan wall 155 and/or a coolant manifold 157. The coolant manifold 157 may provide liquid coolant to provide cooling relative to other components received in the rack 103. As a non-illustrative example, the rack 103 is shown with a first coolant manifold 157A and a second coolant manifold 157B that may respectively correspond to inlet and outlet manifolds. In use, the fan wall 155 may be installed in between the cooling manifolds 157A and 157B, such as by moving from the position shown in the leftward view 501A in FIG. 5 to the position shown in the rightward view 501B in FIG. 5. The fan wall 155 may be suitably arranged to include fans at suitable positions relative to the chassis 105 and/or power shelves 107 that may be coupled or installed into the rack 103 in use. The components depicted in FIG. 5 are only some examples of components that may be included (e.g., along the rear of the rack 103) to facilitate cooling and may be supplemented with or replaced with other components for providing cooling, power interconnectivity, and/or data communication among components in the rack 103.

Based on the disclosure and teachings provided herein, a person of ordinary skill in the art will appreciate other ways and/or methods to implement the various embodiments. The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A computing system assembly, comprising:

a rack comprising a frame arranged to form boundaries of an internal volume of the rack;

a chassis slidingly received in the internal volume of the rack;

a server component borne by the chassis;

a pair of opposing sidewalls incorporated into the frame respectively along a right side and a left side of the frame and each comprising compartments, wherein each of the sidewalls includes an interior panel and an exterior panel arranged so that the compartments are bounded on opposite lateral sides by the interior panel and the exterior panel, wherein the interior panel extends a shorter distance toward a rear of the rack than the exterior panel so as to define a recess between a rear edge of the interior panel and a flange that extends inward from the exterior panel;

a set of battery cartridges received within the compartments in the pair of opposing sidewalls and connected with the server component to supply backup power to the server component; and a busbar received in the recess and in position for establishing connection between the set of battery cartridges and a power shelf that is received in the internal volume of the rack and connected with the server component.

2. The computing system assembly of claim 1, wherein the interior panel and the exterior panel are joined together by crossbars so that the compartments are bounded on opposite vertical sides by the crossbars.

3. The computing system assembly of claim 1, further comprising at least one of:

a fan wall arranged along the rear of the rack; or a coolant manifold arranged along the rear of the rack.

4. A system, comprising:

a rack comprising a frame arranged to form boundaries of an internal volume sized for receipt of computing equipment into the rack;

at least one sidewall incorporated into the frame along a lateral side and comprising compartments, wherein the at least one sidewall includes an interior panel and an exterior panel arranged so that the compartments are bounded on opposite lateral sides by the interior panel and the exterior panel, wherein the interior panel extends a shorter distance toward a rear of the rack than the exterior panel so as to define a recess between a rear edge of the interior panel and a flange that extends inward from the exterior panel;

a set of power units sized to be received within the compartments in the sidewall; and a busbar received in the recess and in position for establishing connection with the set of power units.

5. The system of claim 4, wherein the compartments are formed as continuous openings extending rearwardly through the at least one sidewall.

6. The system of claim 4, wherein the interior panel and the exterior panel are joined together by crossbars.

7. The system of claim 4, wherein the set of power units comprises at least one battery cartridge that comprises:

a shell;

a plurality of battery cells arranged within the shell; and an electronics card configured for at least one of controlling or monitoring operation of the plurality of battery cells.

8. The system of claim 7, wherein the plurality of battery cells comprises a parallel-connected series of lines that each include multiple battery cells connected in series.

9. The system of claim 4, further comprising at least one of a server, power shelf, or other sliding chassis in the rack.

10. The system of claim 4, further comprising:

a chassis slidingly received in the internal volume of the rack;

a server component borne by the chassis; and a power shelf received in the internal volume of the rack and connected with the server component to supply power to the server component;

wherein the at least one sidewall comprises a pair of opposing sidewalls incorporated into the frame respectively along a right side and a left side of the frame, each of the sidewalls forming respective compartments with the rack; and wherein the set of power units comprises a set of battery cartridges that are received within the compartments formed by the pair of opposing sidewalls, and wherein the battery cartridges are connected with the power shelf to supply backup power to the power shelf.

11. A system, comprising:

a rack comprising a frame arranged to form boundaries of an internal volume of the rack, wherein the internal volume includes a main volume sized for receipt of computing equipment, wherein the frame comprises:

a top defining an upper boundary of the main volume;

a bottom defining a lower boundary of the main volume;

a left sidewall coupled with the top and the bottom; and a right sidewall coupled with the top and the bottom, wherein at least one of the left sidewall or the right sidewall is formed as a lateral sidewall comprising:

a lateral interior panel defining a lateral boundary of the main volume; and a lateral exterior panel spaced outwardly from the lateral interior panel so as to define a set of compartments sized for receiving a set of power units, wherein the lateral exterior panel extends continuously toward a rear of the rack; and wherein the lateral interior panel extends a shorter distance toward the rear of the rack than the lateral exterior panel so as to define a recess between a rear edge of the lateral interior panel and a flange that extends inward from the lateral exterior panel, the recess sized for receipt of a busbar within the internal volume and laterally from the main volume.

12. The system of claim 11, further comprising the busbar received in the recess.

13. The system of claim 11, wherein the busbar is engageable from the set of compartments and arranged to be at least one of: positioned within or along the lateral sidewall; positioned laterally from the main volume; or positioned forward of a rear of the internal volume.

14. The system of claim 11, wherein the lateral sidewall comprises openings forming entrances into the set of compartments from a front of the lateral sidewall.

15. The system of claim 11, further comprising the set of power units.

16. The system of claim 11, further comprising at least one of a server, power shelf, or other sliding chassis in the rack.

17. The system of claim 11, further comprising:

a chassis slidingly received in the internal volume of the rack;

a server component borne by the chassis;

a power shelf received in the internal volume of the rack and connected with the server component to supply power to the server component;

wherein the left sidewall and the right sidewall are included in a pair of opposing sidewalls incorporated into the frame respectively along a right side and a left side of the frame and each comprising compartments of the set of compartments; and the set of power units, wherein the set of power units comprises a set of battery cartridges received within the set of compartments in the pair of opposing sidewalls and connected with the power shelf to supply backup power to the power shelf.

* * * * *